United States Patent [19]

Rodgers

[11] 3,878,552

[45] Apr. 15, 1975

[54] BIPOLAR INTEGRATED CIRCUIT AND METHOD

[76] Inventor: Thurman J. Rodgers, 271 Leland St., Palo Alto, Calif. 94306

[22] Filed: Nov. 13, 1972

[21] Appl. No.: 305,983

[52] U.S. Cl. ...................... 357/49; 357/40; 357/34; 357/35; 357/55; 357/60; 357/15

[51] Int. Cl. ............................................ H01l 19/00

[58] Field of Search.... 317/235 AJ, 235 F, 235 AK, 317/235 Y, 235 AM

[56] References Cited

UNITED STATES PATENTS

| | | | |
|---|---|---|---|
| 3,327,182 | 6/1967 | Kisinka | 317/235 |
| 3,396,312 | 8/1968 | Cunningham | 317/101 |
| 3,423,651 | 1/1969 | Legat | 317/235 |
| 3,432,919 | 3/1969 | Resvold | 29/578 |
| 3,460,006 | 8/1969 | Strull | 317/235 |
| 3,463,975 | 8/1969 | Biard | 317/235 |
| 3,486,892 | 12/1969 | Resvold | 96/36.2 |
| 3,636,417 | 4/1969 | Kimura | 317/234 |

*Primary Examiner*—Martin H. Edlow
*Attorney, Agent, or Firm*—Paul Hentzel

[57] ABSTRACT

An integrated circuit formed from starting material including a highly doped substrate of one conductivity type having crystallographic planes at one face thereof which etch preferentially, such as the <100> or <110> planes, and three layers of semiconductor material on said one face, said layers comprising in order a lightly doped or intrinsic layer, a highly doped buried layer and another layer all of opposite conductivity type with a V-groove extending through said layers and into said substrate to define an island and a well within said island extending to a point adjacent said highly doped buried layer and a diffusion region formed in said well to provide connection to the buried layer together with additional regions formed in said island to define with said layers a bipolar semiconductor device.

The method of forming bipolar semiconductor devices in integrated circuits which comprises processing a wafer including crystallographic planes at one face thereof which etch preferentially, such as the <100> or <110> planes, and three layers of semiconductor material on said one face, said layers comprising in order a lightly doped or intrinsic layer, a highly doped buried layer and another layer of opposite conductivity type, masking the surface of the device to form a ring of predetermined width and an opening of predetermined size within said ring and thereafter etching to form a groove extending into the substrate and a well extending adjacent the highly doped buried layer and forming a diffusion region at the surface of the well to provide connection to the highly doped buried layer and additional steps of forming various regions to define bipolar semiconductor devices within said groove.

10 Claims, 23 Drawing Figures

BIPOLAR INTEGRATED CIRCUIT AND METHOD

GOVERNMENT GRANT

The invention described herein was made in the course of work under a grant or award from the Department of Health, Education and Welfare.

BACKGROUND OF THE INVENTION

A number of processes have been used to fabricate bipolar integrated circuits. An early process was the beam lead process where the metal leads served as structural components to hold the individual bipolar devices together as well as providing the electrical connection between the devices. This process, however, has the drawback that it is relatively complicated and expensive. Another process is the isoplanar process in which isolation of devices is achieved by means of silicon oxide. Integrated circuits have also been formed by the so-called vertical anisotropic etch process which replaces the conventional P-type isolation diffusion with a V-shaped groove. A similar process uses a polysilicon back filled V-groove for isolation. Another process employs collector diffusion isolation.

The foregoing processes require the use of a large number of masks, complicated process steps and tight epitaxy control. The devices require a customized buried layer and a subsequent epitaxial deposition which encounters the concomitant problems of non-vertical growth, pattern wash-out and non-planar surfaces. In general then, the prior art processes require long processing times, tight control of the processes leading to high processing costs.

OBJECTS AND SUMMARY OF THE INVENTION

It is a general object of the present invention to provide an improved bipolar integrated circuit and method of forming same.

It is another object of the present invention to provide a bipolar integrated circuit and process employing V-groove isolation.

It is a further object of the present invention to provide a process for forming integrated circuits in which the circuits can be formed with a minimal number of processing steps thereby shortening the processing time.

It is another object of the invention to provide a process for forming bipolar integrated circuits in which tight control of the process steps is not essential.

The foregoing and other objects of the invention are achieved by forming the bipolar semiconductor devices from a starting material which includes a P+ substrate having crystallographic planes at one face thereof which etch preferentially, such as the <100> or <110> planes, with non-critical $\nu$/N+/N− epitaxial layers grown on said face and thereafter diffusing a base region into the N− layer, masking and etching V-grooves to achieve isolation of the devices and provide access to the collector regions, simultaneously masking and diffusing the emitter and collector contacts, masking and etching contact holes in the oxide, and masking to define the aluminum metal contact and lead pattern. If the base is made to extend only over a part of the N− layer, an additional masking step is required to mask the base diffusion.

There is provided a bipolar integrated circuit comprising a P+ substrate with $\nu$/N+/N− epitaxial layers grown thereon, a groove extending through said layers into said substrate to form an isolated island and two diffusion regions formed in said island, said diffusion regions and N− layer forming a bipolar device with an N+ buried layer and connections to said regions and buried layer.

BRIEF DESCRIPTION OF FIGURES

FIGS. 2A–2I show the steps in forming the device shown in FIG. 1.

DESCRIPTION OF PREFERRED EMBODIMENTS

Figure 1:
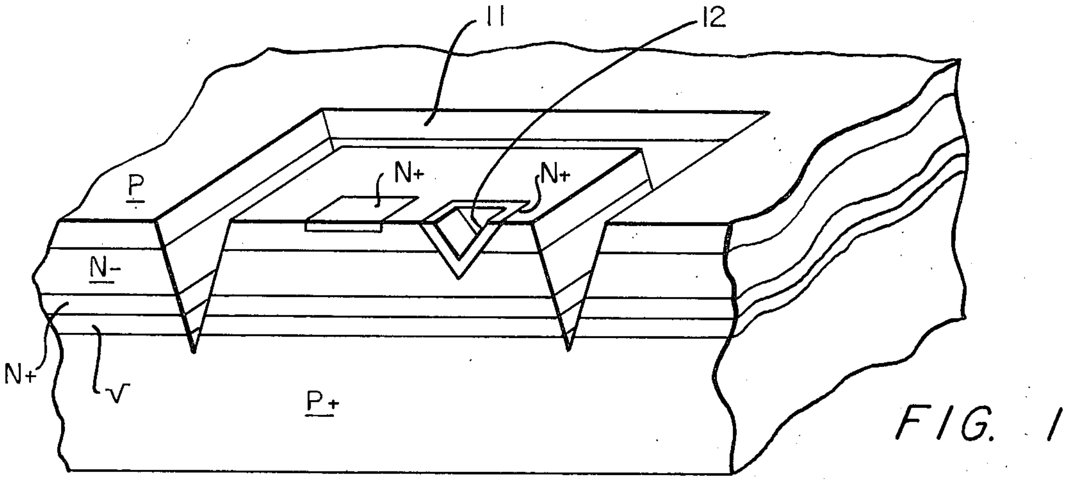
FIG. 1 is a perspective view showing a portion of a bipolar integrated circuit in accordance with the invention showing a bipolar transistor.

A portion of an integrated circuit including a transistor formed in accordance with the invention is shown in FIG. 1. The device includes a P+ substrate, typically 0.02 – 0.04 ohm-cm. material, onto which are grown: an intrinsic epitaxial layer which may be in the order of 1 – 5 microns thick and in the order of 20 – 150 ohm-cm; an epitaxial N+ layer in the order of 0.5 – 3 microns thick and in the order of 0.001 – 0.01 ohm-cm.; and an upper N− layer in the order of 2 – 15 microns thick and in the order of 1 – 10 ohm-cm.

A P-type base layer formed by an unmasked base diffusion is diffused into the N− layer. Groove 11 isolates the device and hole 12 extends into the N− collector region and provides a connection to the N+ buried layer. An N+ emitter is formed by diffusion into the base layer and an N+ layer in the hole 12 to provide a collector contact. The NPN transistor includes the N+ emitter, a P-base and N− collector with an N+ buried layer isolated from the substrate by the intrinsic region.

Referring now particularly to FIGS. 2A–2I, the steps in forming the device of FIG. 1 are illustrated. The first step is to select a P+ substrate. The substrate is heavily doped to prevent surface channeling around the bottom of the V-grooves. The three epitaxial layers $\nu$/N+/N− are grown on the substrate as shown in FIGS. 2B, 2C and 2D. The triple epitaxial layer may be grown continuously to give the same crystalline quality as a single layer. For such growth, the reactor should be programmable to give reproducible results switching on and off dopants as the silicon continuously grows. junction lags due to time taken to change reactor gases are avoided by using a high flow (0.6 L/min/cm$^2$) horizontal reactor. If $SiH_4$ epitaxy is used in a reactor with high main flow at a temperature of 1050°C, with a growth rate near 0.25 micron/min., little extra difficulty is encountered growing the $\nu$/N+/N− layers over growing a conventional epitaxial layer. Thickness and resistivity control are important only for the top N− collector layer and to no greater degree than for standard processes.

A combination of $SiH_4$—$SiCl_4$ epitaxy has given best results. The nearly intrinsic $\nu$ layer and N+ buried layer are grown with silane to achieve abrupt profiles. The temperature is changed and the top N− layer is grown in the usual way with $SiCl_4$ which gives a faster growth rate and better uniformity for the thick layer. Further improvement is possible if one grows the first $\nu$/N+ layers with $SiH_4$ and continues with another thin (approximately 0.5 micron) layer grown with undoped silane. When the $SiCl_4$ N− collector layer is grown immediately on top of the structure, there is no autodoping because the buried layer has been sealed off.

The next step in the process, FIG. 2E, is to perform an unmasked base diffusion to form the upper P-layer. This is most conveniently done directly after the epitaxy so that a minimum of extra cleaning steps are needed. Thus, the wafer, FIG. 2E, has been produced completely by unmasked processes. At this point the wafer can be tested and evaluated, selected or rejected without losing the effort of any previous masking step. Furthermore, if the starting material is purchased, epitaxial facilities are not needed to produce high performance integrated circuits with buried layers.

The wafer is then provided with an oxide mask 13 which includes openings 14 defining the isolation etch pattern by conventional masking and etching procedures. The wafer, FIG. 2F, is then subjected to a hydrazine anisotropic etch. When hydrazine is mixed with water 100 g $N_2H_4$/50ml $H_2O$ (a molar ratio 1.14/1, $N_2H_4/H_2O$) and heated to 100°C, it etches into the <100> planes of silicon at a rate of approximately 3 microns per minute. The etch rate into the <111> planes is much slower. Consequently, when geometries parallel to the <110> axes (parallel or perpendicular to the flat of a <100> wafer) are opened through a 1000 Angstrom silicon oxide mask and anisotropically etched, an V-groove is formed. The V-groove is self-stopping since once all of the <100> surface is etched, the remaining <111> oriented side walls etch very slowly. The wall of the groove slopes down from horizontal at approximately 55°. The bottom V-angle is 70°. The depth, *D*, of the groove of a given width, *W*, is, therefore, determined by $D/W = 0.7$. The grooves etch at a 3 micron/min. rate until they are V-shaped, after which the etch rate is 0.4 micron/min. For example, with a 6 minute etch and oxide openings of 7 microns, 17 microns and 27 microns, it is possible to simultaneously etch grooves of depths of 5.3 microns, 11.9 microns and 18.9 microns, respectively.

The openings in the oxide for the isolation mask are selected of a width such that the surrounding V-groove 11 extends into the P+ substrate to form an isolated island, while the hole 12 extends into the N− layer to provide contact to the N+ layer, FIG. 2G. The wafer is cleaned and oxidized 16, and emitter and collector contact windows 17, 18 are opened as shown in FIG. 2H. A phosphorus diffusion simultaneously produces the N+ emitter region and the N+ layer in hole 12 to contact the N− collector region. Oxidation 19 and etching form openings 21 in the oxide for the contacts, FIG. 2I. The final masking step, not shown, defines the aluminum contacts and interconnections for the integrated circuit.

Figures 2, 3:
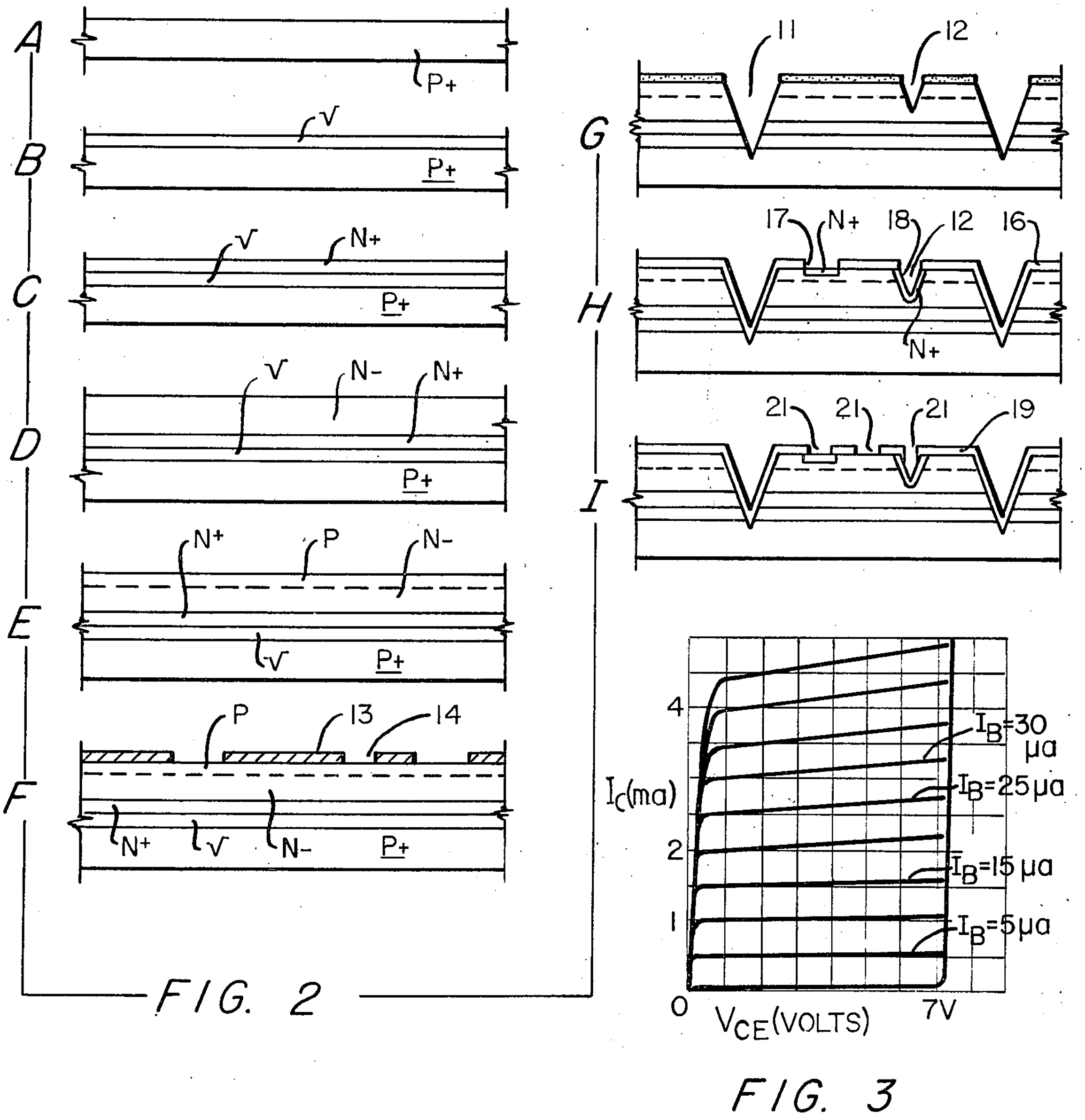
FIG. 3 shows typical characteristics for the device shown in FIG. 1.

Potential problems in bipolar integrated structures include base surface channeling and substrate surface channeling between adjacent transistor collectors at the bottom of the V-grooves. Surface channels are eliminated by the heavy surface concentration of the base diffusion and the P+ substrate eliminates the V-groove channels. FIG. 3 shows the characteristics of a device formed in accordance with the foregoing and having the following parameters:

| | | |
|---|---|---|
| P+ substrate | = | .04 ohm-cm |
| $\nu$ layer | = | ≥50 ohm-cm |
| N+ layer | = | 2 micron, .005 ohm-cm |
| N− layer | = | 5 micron, 5 ohm-cm |
| P layer | = | 900°C predeposit<br>30 min. ($B_2H_6$)<br>1100°C diffusion<br>40 min. (dry) |
| N emitter and collector contact | = | 1050°C<br>25 min. ($POCl_3$) |

The current gain is maintained within a factor of two over six orders of magnitude of collector current. There is a sharp collector-base avalanche breakdown at $V_{CE} = 7$ volts which occurs because the collector-base and emitter-base junctions are identical in having an N+/P+ junction at the surface.

Figure 4:
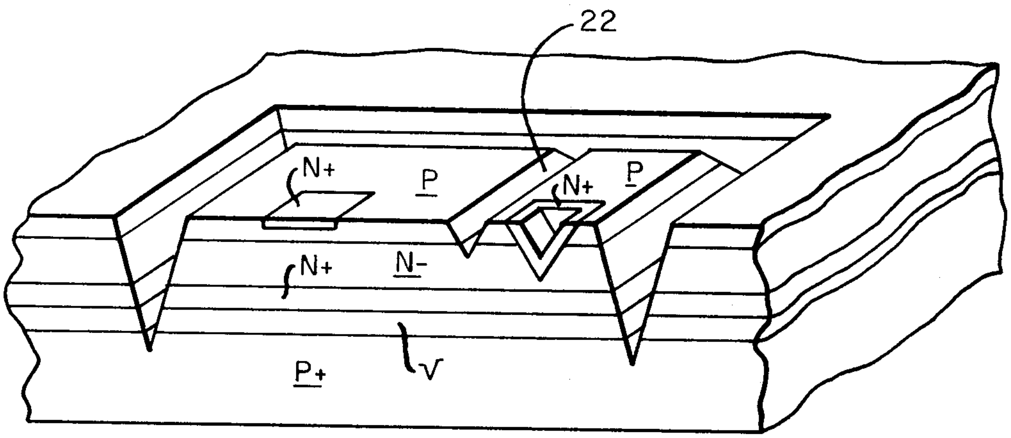
FIG. 4 is a perspective view of a portion of an integrated circuit showing another transistor formed by the process of the present invention.
Figure 5:
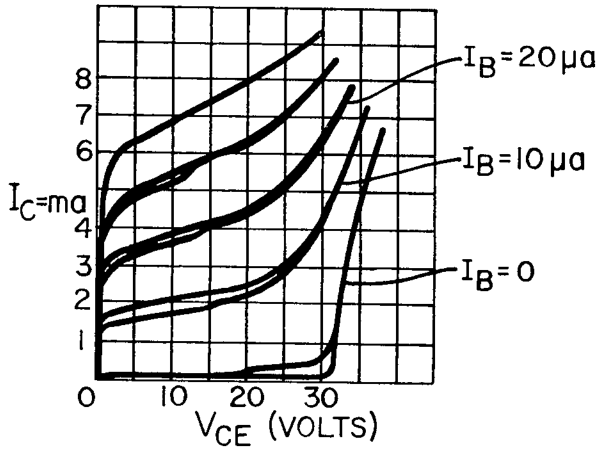
FIG. 5 shows the characteristics of the device shown in FIG. 4.

FIG. 4 shows a transistor in which the breakdown limitation is overcome. The transistor includes a V-groove 22 which is deep enough to sever from the base the region surrounding the collector contact, but not so deep as to cut through the collector. As a consequence, no potential is developed across the N+/P+ junction at the surface. The collector-base avalanche voltage of the device of FIG. 4 is in the order of 60 volts. Typical characteristics for the device of FIG. 4, which is otherwise in accordance with the device of FIG. 1, are shown in FIG. 5.

Figure 6:
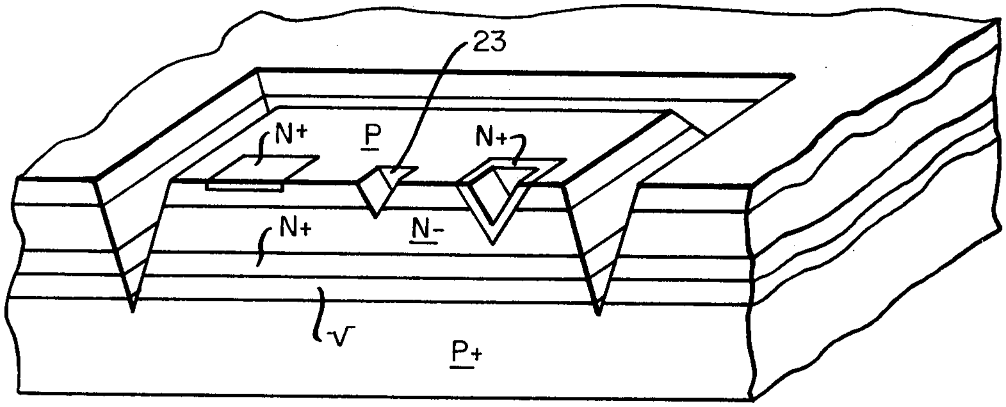
FIG. 6 is a perspective view of a portion of an integrated circuit showing another transistor formed in accordance with the process of the present invention.
Figures 7, 8:
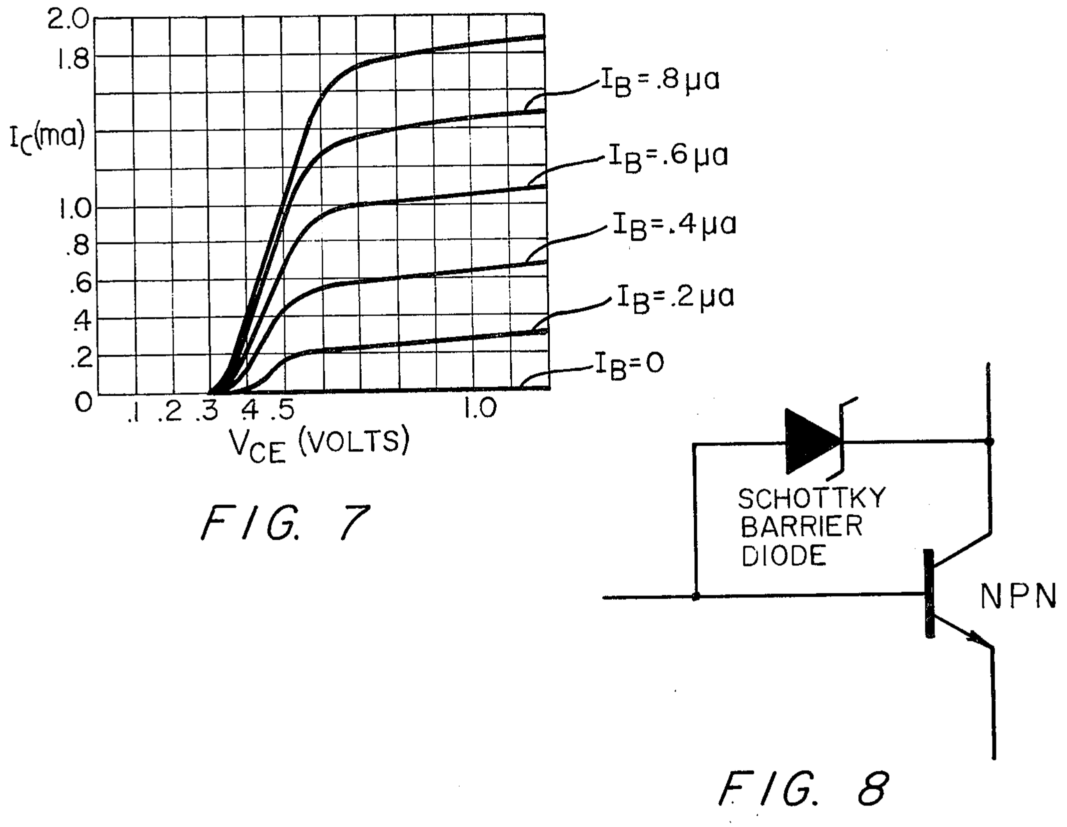
FIG. 7 shows the characteristics of the device of FIG. 6.
FIG. 8 is a circuit diagram of the device shown in FIG. 6.

FIG. 6 shows how a Schottky-clamped transistor can be fabricated. The schottky-clamped transistor uses a shallow hole 23 to allow base contact metal to reach the underlying N− collector layer. The base contact metal then forms a Schottky barrier diode with the collector. The characteristics for the device shown in FIG. 7 compared with the characteristics of FIG. 3 and show that the forward drop of the Schottky diode and the saturation voltage of the device are such that the Schottky-clamped NPN transistor operates well out of saturation. A schematic circuit diagram of the device of FIG. 6 is shown in FIG. 8.

It is to be noted that both of the devices in FIGS. 4 and 6 can easily be fabricated by making use of the fact that grooves of different depths can be made simultaneously during the isolation etch.

Figure 9:
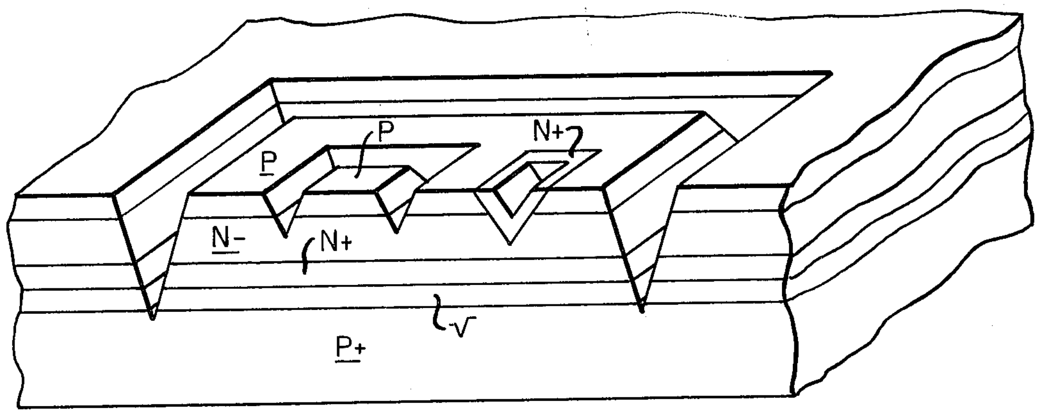
FIG. 9 is a perspective view of a portion of an integrated circuit including another transistor formed in accordance with the process of the present invention.

FIG. 9 shows the structure of a lateral PNP transistor fabricated with a four mask process as described with reference to FIG. 2. The transistor has a "ring-dot" structure with its base along the bottom of a shallow V-groove. A device was constructed as follows:

| | | |
|---|---|---|
| P+ substrate | = | .04 ohm-cm |
| ν layer | = | 50 ohm-cm |
| N+ layer | = | 2 micron, .005 ohm-cm |
| N− layer | = | 5 micron, 5 ohm-cm |
| P layer | = | 900°C predeposit<br>30 min. ($B_2H_6$)<br>1100°C diffusion<br>40 min. (dry) |
| N emitter and collector contact | = | 1050°C<br>25 min. ($POCl_3$) |

Figure 10:
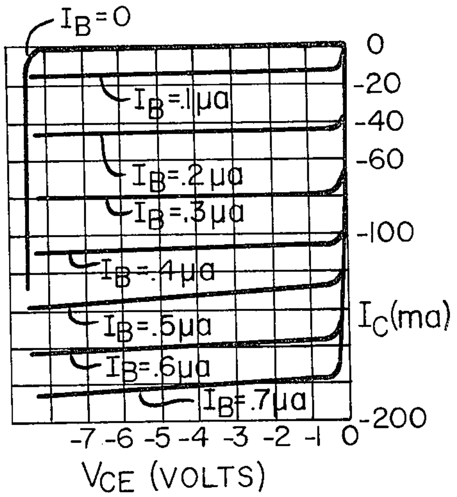
FIG. 10 shows the characteristics of the device shown in FIG. 9.

The characteristics of the device of FIG. 9 are shown in FIG. 10.

Figure 11:
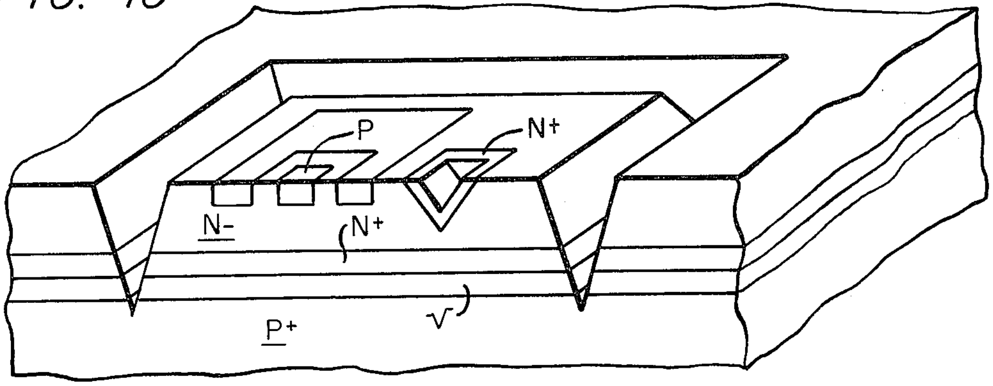
FIG. 11 is a perspective view of a portion of an integrated circuit including another transistor formed in accordance with the invention.
Figure 12:
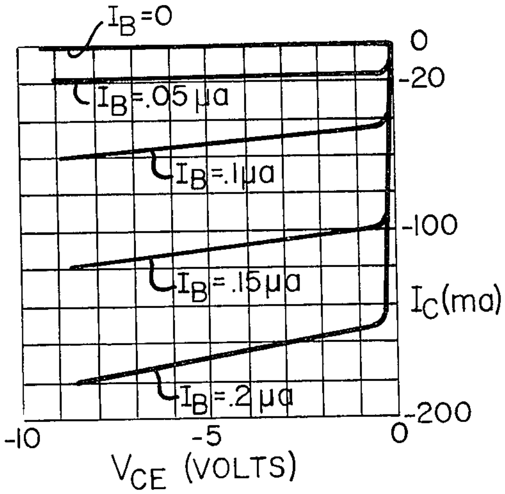
FIG. 12 shows the characteristics of the device shown in FIG. 11.

The bipolar transistors described above are examples of devices employing four masking steps. The use of an additional masking step can provide a base region which extends only over a part of the N− layer. A device formed with five masking steps is shown in FIG. 11. The characteristics of the device are shown in FIG. 12. The use of a masked base diffusion prior to the isolation etch provides a surface layer PNP transistor with a simplified groove structure. The transistor has essentially the same characteristics as those produced by planar processing. The use of a masked diffusion permits formation of high voltage NPN transistors without the use of a shallow groove and the formation of Schottky barrier diodes more easily than large area V-groove diodes.

Figure 13:
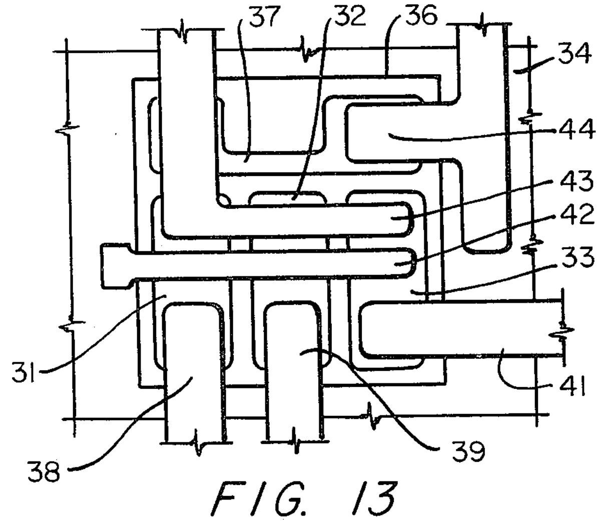
FIG. 13 is a plan view of a NOR gate formed in accordance with the invention.
Figure 14:
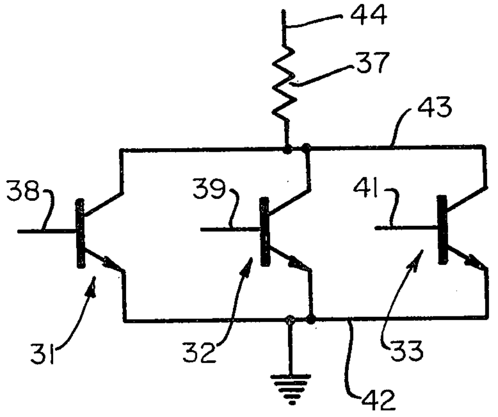
FIG. 14 is the circuit diagram of the integrated circuit of FIG. 13.

FIG. 13 is a plan view of a three-input NOR gate using direct coupled transistor logic formed with the bipolar transistors in accordance with the invention. FIG. 14 is a schematic circuit diagram of the NOR gate. Three isolated bipolar NPN transistors 31, 32 and 33 of the type shown in FIGS. 1 and 2 are formed in a substrate 34. An isolation groove 36 defines the three transistor regions and a region for the resistor 37. Conductors 38, 39 and 41 provide the input connections to the bases of the three transistors. Conductor 42 provides connection to all of the emitters and is grounded. Conductor 43 provides connection between the collectors and to one terminal of resistor 37 and conductor 44 provides connection to the other resistor terminal.

The bipolar integrated circuits described can be formed as described with the starting material comprising a substrate with two epitaxial layers N+/N− rather than three layers ν/N+/N− where the substrate is not as heavily doped. The advantage of such circuits is that they can be thinner in the order of the thickness of the ν layer. Such structures are not as advantageous as those described in that they will have higher collector-substrate capacitance, the possibility of surface inversion at the bottom of the groove and lower break-down voltages of the collector-substrate junction. However, the structure still has the advantage of a simplified fabrication process.

Figure 15:
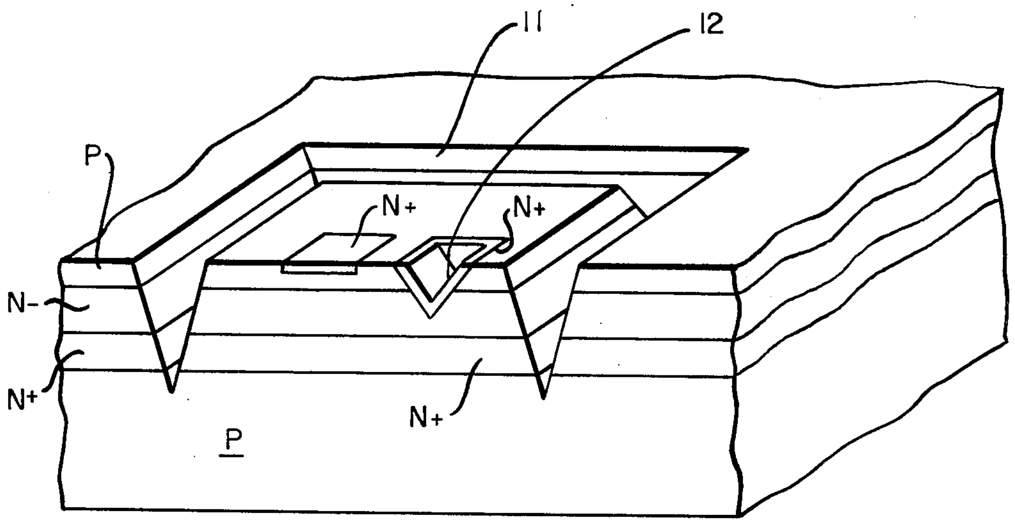
FIG. 15 is a perspective view showing a portion of a bipolar integrated circuit in accordance with another embodiment of the invention.

Referring to FIG. 15, a typical device formed in accordance with this latter embodiment is shown. The device includes a P-type <100> substrate, typically 0.1 ohm-cm to 1 ohm-cm; an N+ epitaxial layer in the order of 2–20 microns thick and in the order of 0.5 – 10 ohm-cm; and an N− epitaxial layer in the order of 0.5 – 3 microns thick and in the order of 0.001 – 0.02 ohm-cm. The remainder of the regions and the processing are as shown and described in connection with FIGS. 1 and 2.

I claim:

1. An integrated circuit including a bipolar semiconductor device comprising a wafer including a highly doped substrate of one conductivity type having its <100> crystallographic planes at one face thereof and three layers of semiconductor material on the entire surface of said one face, said layers comprising in order a lightly doped or intrinsic layer, a highly doped layer, and another layer all of opposite conductivity type, a V-groove extending through said layers into said substrate to define an island, a well extending into said island with a diffusion region of opposite conductivity type formed along the surface thereof to provide electrical connection to said highly doped layer, a diffusion region of one conductivity type extending into said another region, an emitter region of opposite conductivity type formed in said diffusion region, ohmic connections formed with said emitter region, said diffusion region, and said well diffusion region, and another V-groove extending across said island through said diffusion region to isolate said diffusion region from said well diffusion region.

2. An integrated circuit including a bipolar semiconductor device comprising a wafer including a highly doped substrate of one conductivity type having its <100> crystallographic planes at one face thereof and three layers of semiconductor material on the entire surface of said one face, said layers comprising in order a lightly doped or intrinsic layer, a highly doped layer, and another layer all of opposite conductivity type, a V-groove extending through said layers into said substrate to define an island, a well in said island extending to a point adjacent said highly doped buried layer, a diffusion region of opposite conductivity type formed at the surface of said well to provide a connection to said highly doped layer, and a diffusion region of one conductivity type formed in said another region and a closed groove extending through said diffusion region into said another region to define a diffused island on the surface of said device.

3. A single crystal silicon wafer integrated circuit including a plurality of bipolar NPN transistor islands comprising:

a P-type silicon substrate;

a heavily doped N-type buried layer epitaxially formed over the silicon substrate layer;

an N-type collector layer epitaxially formed over the buried layer;

a P-type base region over at least a portion of the collector layer;

a V-groove therearound extending into the substrate for isolating the island from the adjacent islands;

an N-type emitter region diffused into the base region;

a V-groove well extending into the island and having a N-doped surface for providing electrical access to the collector layer;

an insulative layer over the island; and conductive leads extending through the insulative layer in electrical connection with the base region, with the emitter region, and with the collector region through the doped surface of the well.

4. The integrated circuit of claim 3, wherein a lightly layer or intrinsic layer is provided between the substrate and the buried layer, and epitaxially interfacing with the substrate and the buried layer.

5. The integrated circuit of claim 4, wherein the base region extends over the entire island.

6. The integrated circuit of claim 5, wherein a divider V-groove extends into the island deeper than the base region and extends across the island separating that portion of the island having the emitter region from that portion of the island having the well with the doped surface.

7. The integrated circuit of claim 5, wherein another V-groove well extends through the base region and forms a Schottky diode with the collector layer.

8. The integrated circuit of claim 5, wherein at least a portion of the bipolar transistors are PNP type and are formed by providing a closed V-groove in the base region to form the emitter element and the collector element of the PNP transistor, and the collector layer forms the base element of the PNP transistor.

9. The integrated circuit of claim 4, wherein the base region extends over only a portion of the island and is formed by diffusion of P-type dopants into the collector layer.

10. The integrated circuit of claim 9, wherein at least a portion of the bipolar transistors are PNP type and are formed by spaced diffusions of P-type dopants into the collector layer.

* * * * *